(12) United States Patent
Furukawa et al.

(10) Patent No.: US 7,923,833 B2
(45) Date of Patent: Apr. 12, 2011

(54) SEMICONDUCTOR MODULE

(75) Inventors: Yuichi Furukawa, Oyama (JP); Shinobu Yamauchi, Oyama (JP); Nobuhiro Wakabayashi, Oyama (JP); Shintaro Nakagawa, Oyama (JP); Keiji Toh, Kariya (JP); Eiji Kono, Kariya (JP); Kota Otoshi, Kariya (JP); Katsufumi Tanaka, Kariya (JP)

(73) Assignees: Showa Denko K.K., Minato-ku, Tokyo (JP); Kabushiki Kaisha Toyota Jidoshokki, Aichi-ken (JP)

( * ) Notice: Subject to any disclaimer, the term of this patent is extended or adjusted under 35 U.S.C. 154(b) by 0 days.

(21) Appl. No.: 12/086,715

(22) PCT Filed: Dec. 11, 2006

(86) PCT No.: PCT/JP2006/324683
§ 371 (c)(1),
(2), (4) Date: Nov. 10, 2008

(87) PCT Pub. No.: WO2007/072700
PCT Pub. Date: Jun. 28, 2007

(65) Prior Publication Data
US 2009/0174063 A1    Jul. 9, 2009

(30) Foreign Application Priority Data

Dec. 20, 2005   (JP) ................. 2005-366975

(51) Int. Cl.
*H01L 23/06* (2006.01)

(52) U.S. Cl. .................. 257/705; 257/706; 257/E23.08

(58) Field of Classification Search .............. 257/706, 257/690, 703, 713, E23.08, E23.01, E23.077, 257/705, 717–719
See application file for complete search history.

(56) References Cited

U.S. PATENT DOCUMENTS
5,527,620 A   6/1996   Schulz-Harder

FOREIGN PATENT DOCUMENTS
DE   103 37 640 A1   3/2005
(Continued)

OTHER PUBLICATIONS

International Search Report for the corresponding PCT application No. PCT/JP2006/324683, mailed on Jan. 9, 2007.
English translation of the International Preliminary Report on Patentability, Application No. PCT/JP2006/324683.

(Continued)

*Primary Examiner* — Davienne Monbleau
*Assistant Examiner* — Hoa B Trinh
(74) *Attorney, Agent, or Firm* — Locke Lord Bissell & Liddell LLP

(57) ABSTRACT

A semiconductor module 10 includes a ceramic substrate having a front surface on which a semiconductor element 12 is mounted and a rear surface on the opposite side of the front surface, a front metal plate 15 joined to the front surface, a rear metal plate 16 joined to the rear surface, and a heat sink 13 joined to the rear metal plate 16. The rear metal plate 16 includes a joint surface 16b that faces the heat sink 13. The joint surface 16b includes a joint area and a non-joint area. The non-joint area includes recesses 18 which extend in the thickness direction of the rear metal plate 16. The joint area of the rear metal plate 16 is in a range from 65% to 85% of the total area of the joint surface 16b on the rear metal plate 16. As a result, excellent heat dissipating performance can be achieved while occurrence of distortion and cracking due to thermal stress is prevented.

5 Claims, 5 Drawing Sheets

FOREIGN PATENT DOCUMENTS

| | | |
|---|---|---|
| JP | 7-086703 | 3/1995 |
| JP | 8-274423 | 10/1996 |
| JP | 2003-017627 | 1/2003 |
| JP | 2004-207587 A | 7/2004 |

OTHER PUBLICATIONS

Supplemental European Search Report for Application No. 06834438.1-1235, dated Jul. 20, 2010.

Office Action for corresponding Japanese Application No. 2005-366975, dated Dec. 14, 2010.

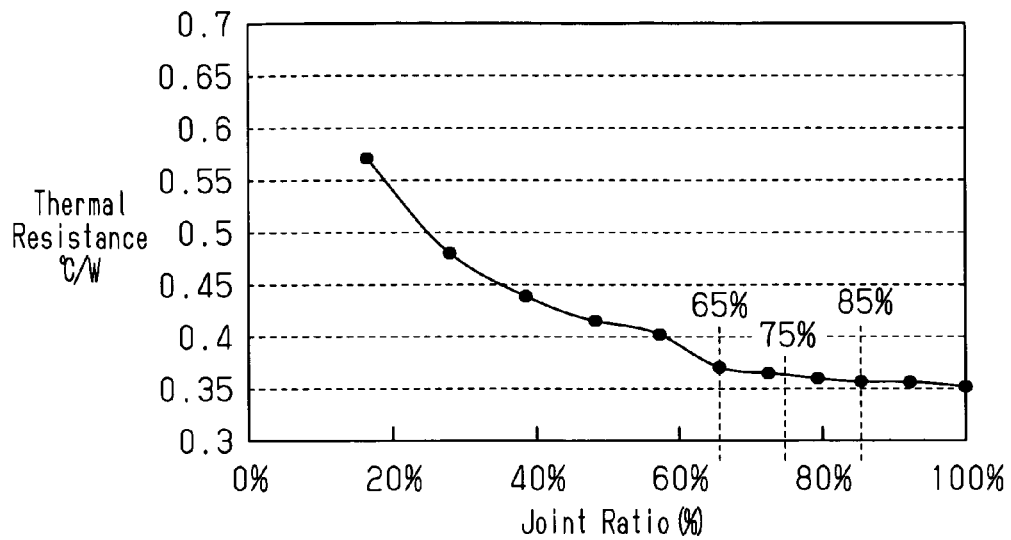
Fig.4
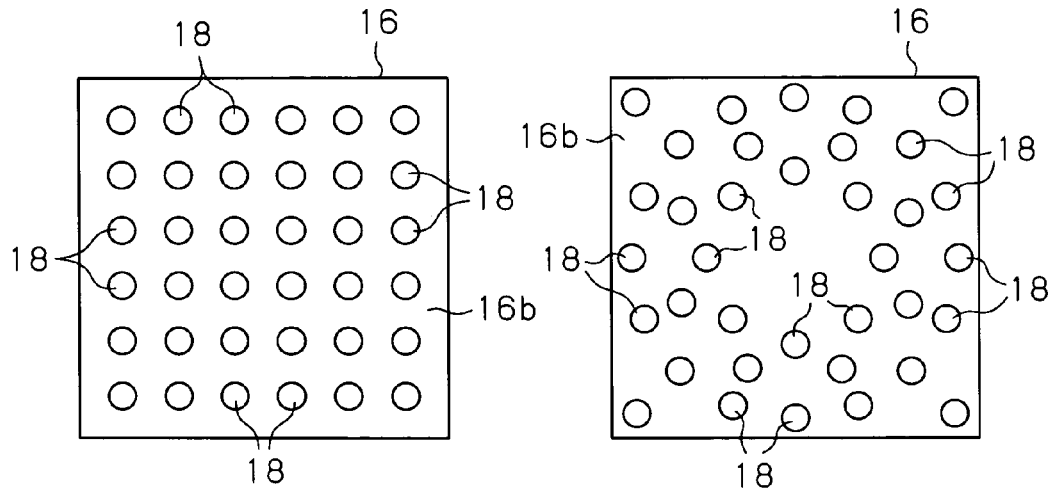
Fig.5(a) Fig.5(b)
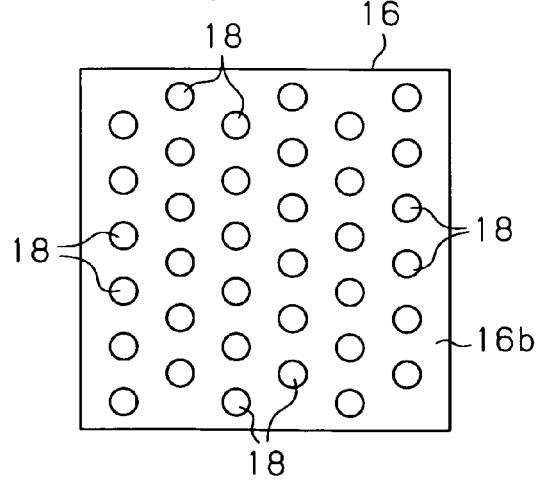
Fig.5(c)

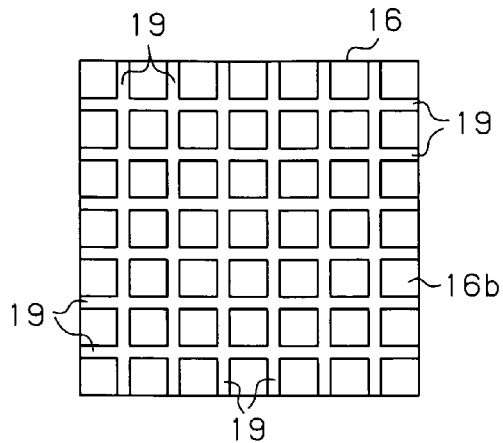
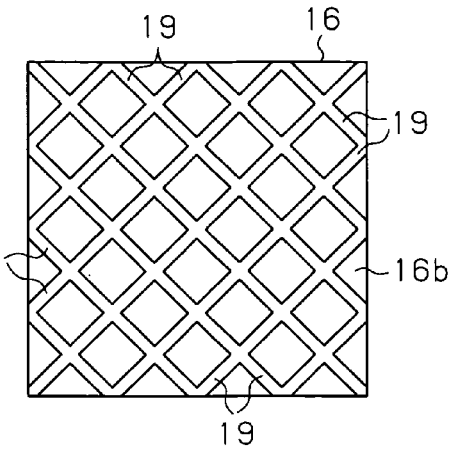
Fig.6(a)          Fig.6(b)
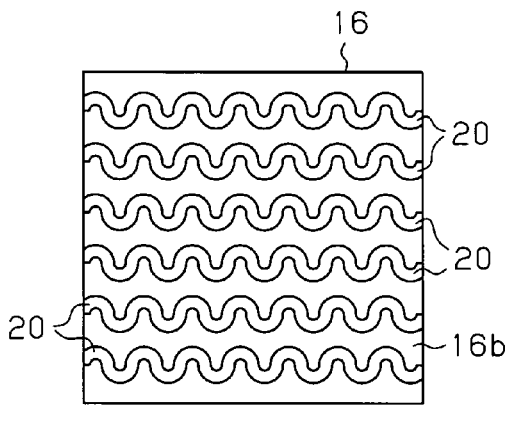
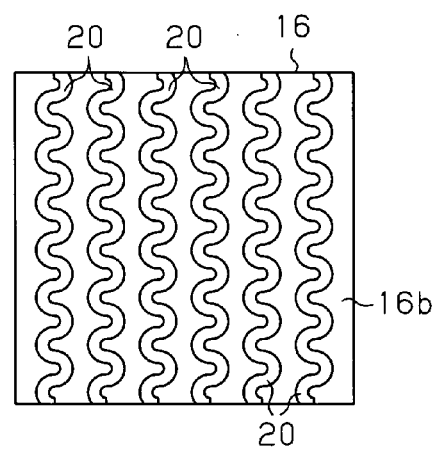
Fig.7(a)          Fig.7(b)
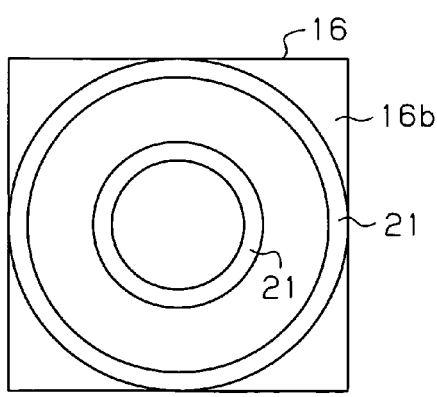
Fig.8

SEMICONDUCTOR MODULE

FIELD OF THE INVENTION

The present invention relates to a semiconductor module provided with a ceramic substrate, a front metal plate and a rear metal plate which are joined on the two surfaces, a the front surface and a rear surface, of the substrate, respectively, and a heat dissipating apparatus joined to the rear metal plate.

BACKGROUND OF THE INVENTION

It is generally known that some semiconductor modules have a ceramic substrate or an insulating substrate such as that made of aluminum nitride; a front metal plate and a rear metal plate which are made of material such as pure aluminum and joined on the two surfaces, a front surface and a rear surface, of the substrate, respectively; a semiconductor element joined to the front metal plate; and a heat sink which is connected to the rear metal plate and serves as a heat dissipating apparatus for dissipating heat generated by the semiconductor element. In such semiconductor modules, it is required for the heat dissipating performance of the heat dissipating apparatus to be maintained over a long period of time. In conventional configurations, however, cracking or distortion may occur in the joint portions due to thermal stress resulting from the difference in the coefficient of linear thermal expansion among the ceramic substrate, the metal plates and the heat dissipating apparatus, depending on the conditions for use, and thus the heat dissipating performance may deteriorate.

In order to solve this problem, a semiconductor module has been proposed in Patent Document 1. Regarding the semiconductor module of Patent Document 1, a thermal stress alleviating portion is created in the rear metal plate as a step, a trench or a recess having a predetermined depth so as to alleviate thermal stress. This thermal stress alleviating portion is provided so that the volume ratio of the rear metal plate to the front metal plate is set to 0.6 or less.

In semiconductor modules having the above described configuration, heat emitted from the semiconductor element is conveyed from the front metal plate, to which the semiconductor element is joined, through the ceramic substrate to the rear metal plate in order so that heat is dissipated via the heat dissipating apparatus. Therefore, it is preferable for the area at which the rear metal plate and the heat dissipating apparatus are joined to be as large as possible, in order to improve the heat dissipating performance. As described above, however, thermal stress is generated between the rear metal plate and the heat dissipating apparatus. While it is preferred to form a thermal stress alleviating portion on the rear metal plate to alleviate this thermal stress, as in Patent Document 1, this makes the joint area smaller by the area of the thermal stress alleviating portion. That is, while it is preferred in semiconductor modules to form a thermal stress alleviating portion even if the joint area at which the rear metal plate and the heat dissipating apparatus are joined becomes smaller, the efficiency in heat dissipation is lowered due to the reduction in the area of the heat conveying portion when the joint area is too small. Therefore, it is necessary to maintain good balance between alleviation of thermal stress and increase in the heat dissipating performance.

Patent Document 1: Japanese Unexamined Patent Publication 2003-17627

SUMMARY OF THE INVENTION

An object of the present invention is to provide a semiconductor module that prevents distortion and cracking generated due to thermal stress and exhibits excellent heat dissipating performance.

A semiconductor module according to the present invention includes a ceramic substrate having a front surface on which a semiconductor element is mounted and a rear surface on the side opposite to the front surface, a front metal plate joined to the front surface, a rear metal plate joined to the rear surface and a heat dissipating apparatus joined to the rear metal plate. The ceramic substrate includes aluminum nitride. The front metal plate and the rear metal plate include aluminum. The rear metal plate has a joint surface that faces the heat dissipating apparatus. The joint surface includes a joint area and a non-joint area, wherein the joint area is in a range from 65% to 85% of the total area of the joint surface.

BRIEF DESCRIPTION OF THE DRAWINGS

FIG. 4 is a graph illustrating the relationship between the thermal resistance and the joint ratio;
FIGS. 5(a) to 5(c) are plan views illustrating the rear metal plates according to another embodiment;
FIGS. 6(a) and 6(b) are plan views illustrating the rear metal plates according to yet another embodiment;
FIGS. 7(a) and 7(b) are plan views illustrating the rear metal plates according to still another embodiment;
FIG. 8 is a plan view illustrating the rear metal plate according to yet still another embodiment.

DETAILED DESCRIPTION OF THE PREFERRED EMBODIMENTS

One embodiment according to the present invention will be described with reference to FIGS. 1 to 5.

Figure 1:
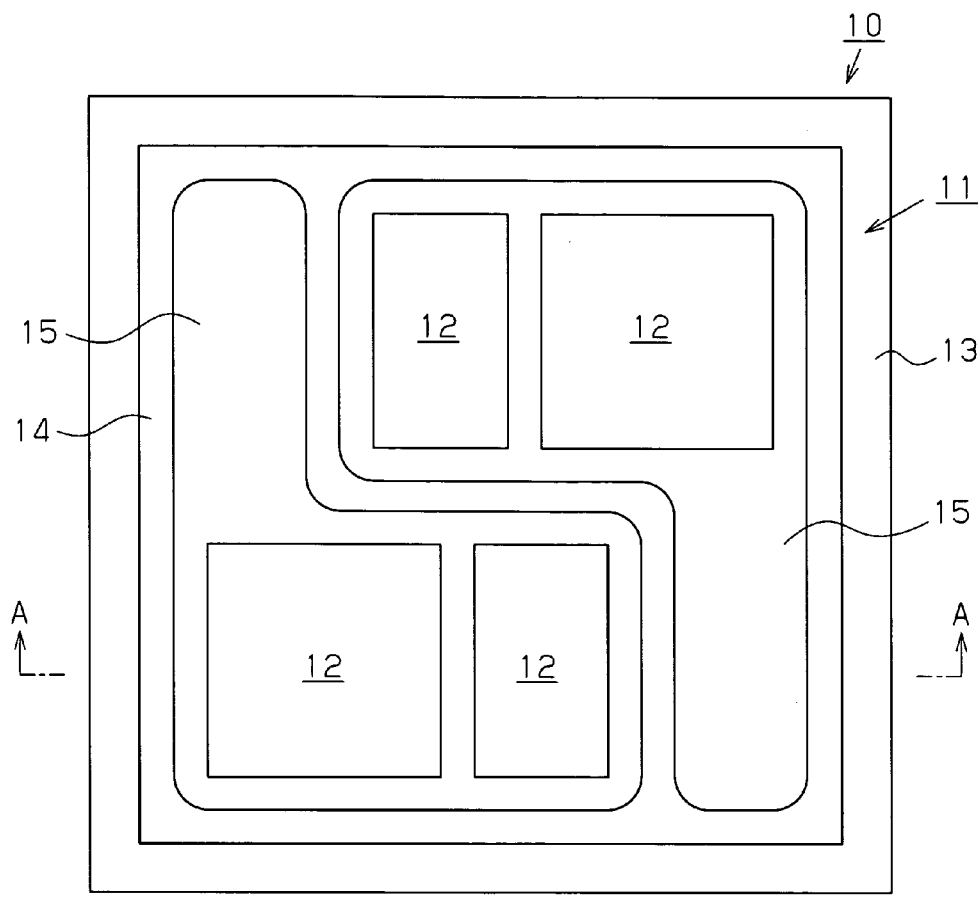
FIG. 1 is a plan view illustrating a semiconductor module.
Figure 2:
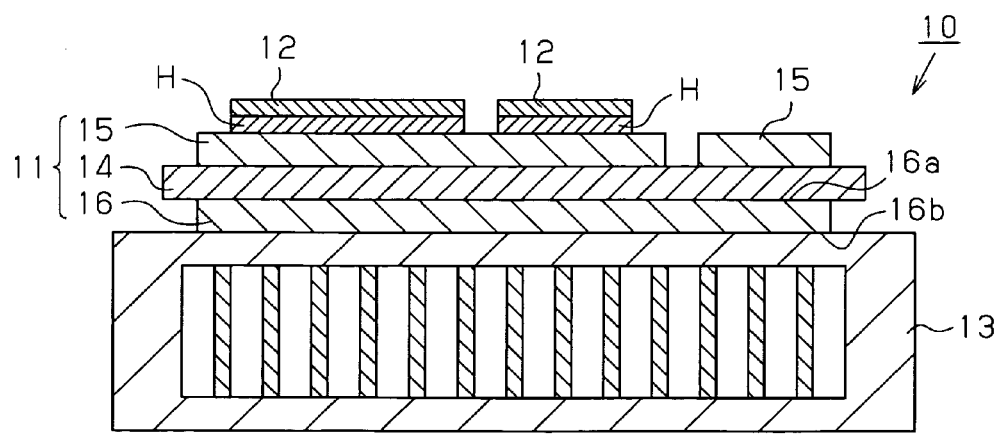
FIG. 2 is a cross sectional view taken along the line 2-2 in FIG. 1.

As illustrated in FIGS. 1 and 2, a semiconductor module 10 includes a circuit substrate 11, semiconductor elements 12 which are joined to the circuit substrate 11, and a heat sink 13 which is a heat dissipating apparatus. The circuit substrate 11 includes a ceramic substrate (insulating substrate) 14, and front metal plates 15 and a rear metal plate 16, which are respectively joined to the opposite surfaces, a front surface and a rear surface, of the substrate 14. In FIG. 2, the upper side or the front surface side of the ceramic substrate 14 is a surface on which a semiconductor element is mounted and the front metal plates 15 serving as a wire layer are joined to the front surface. In addition, the semiconductor elements 12 are joined to the front metal plates 15 via a joining layer H. In this embodiment, the joining layer H is a solder layer. The semiconductor elements 12 are made of IGBTs (insulated gate bipolar transistors) and diodes, and a plurality of the semiconductor elements 12 (four in this embodiment) are joined to the circuit substrate 11 (front metal plate 15). In FIG. 2, the rear metal plate 16 is joined on the lower side or the rear surface side of the ceramic substrate 14. A heat sink 13 is joined to the rear metal plate 16. The rear metal plate 16 serves as a joining layer for joining (metal joining) the ceramic substrate 14 and the heat sink 13. The rear metal plate 16 is brazed to the heat sink 13 directly.

Next, the circuit substrate 11 in the present embodiment is described in detail.

The ceramic substrate 14 is made of aluminum nitride and in square plate form in a plan view as illustrated in FIG. 1. The ceramic substrate 14 is a square having a size of 30 mm×30 mm. The thickness of the ceramic substrate 14 (plate thickness) is 0.635 mm.

The front metal plates 15 are made of pure aluminum (for example 1000 series aluminum, which is pure aluminum for industrial use). The front metal plates 15 are in generally square of a combination of two L-shaped metal plates in a plan view, as illustrated in FIG. 1. The area where the front metal plates 15 are placed on the ceramic substrate 14 is 27 mm×27 mm. The thickness of each front metal plate 15 (plate thickness) is 0.6 mm.

Figure 3A:
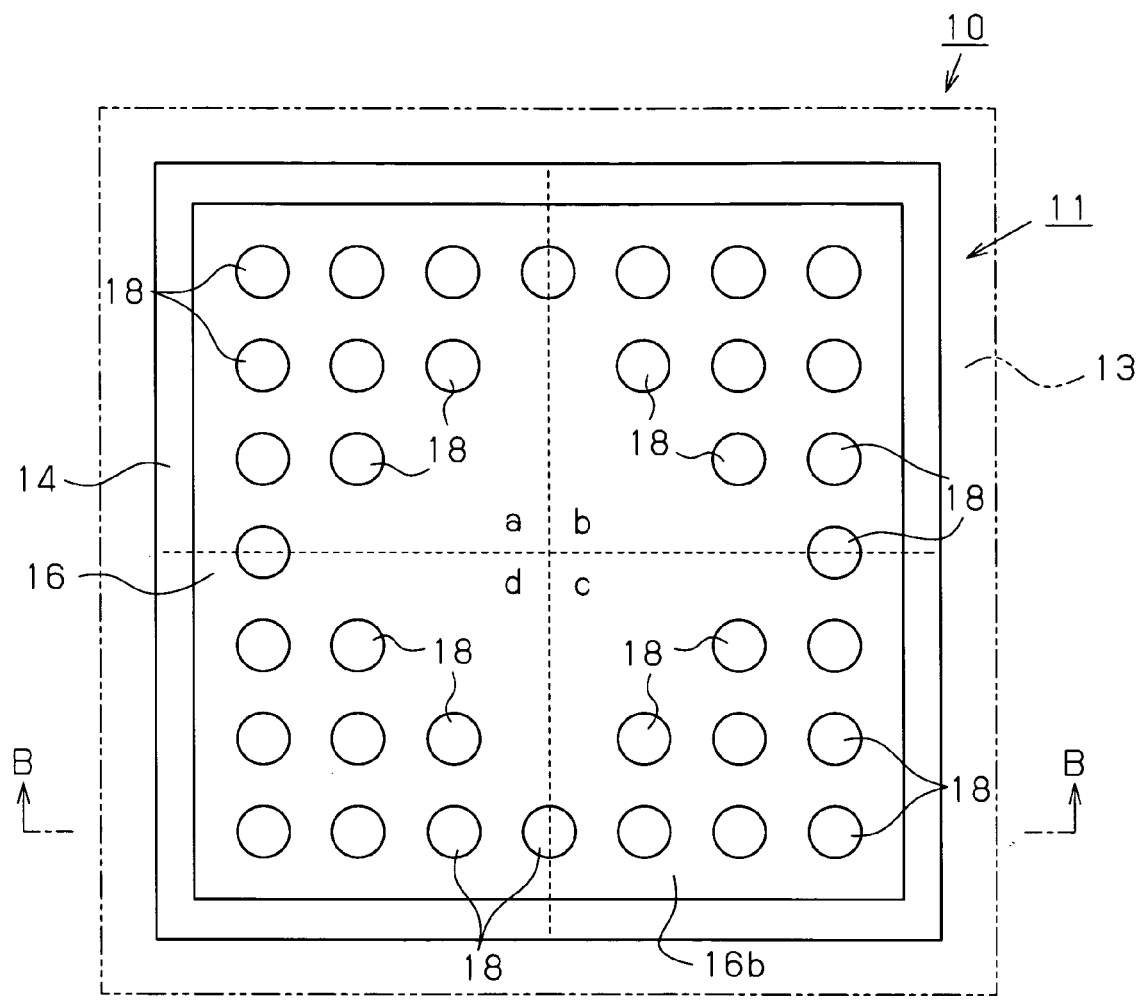
FIG. 3(a) is a plan view illustrating a rear metal plate according to an embodiment.
Figure 3B:
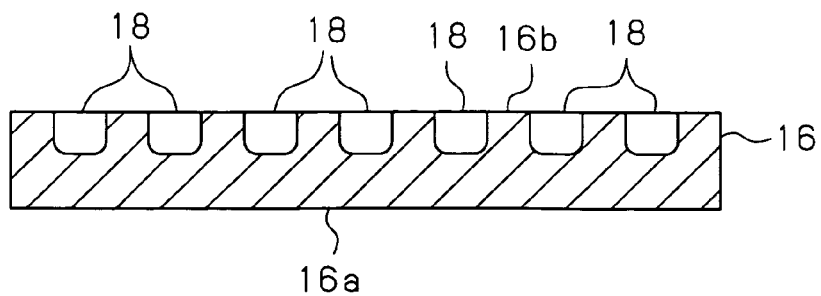
FIG. 3(b) is a cross sectional view taken along the line 3b-3b in FIG. 3(a)

The rear metal plate 16 is made of pure aluminum (for example 1000 series aluminum, which is pure aluminum for industrial use). The rear metal plate 16 is in square plate form in a plan view, as illustrated in FIG. 3($a$), and the area where the rear metal plate 16 is placed on the ceramic substrate 14 is a square having a size of 27 mm×27 mm. As illustrated in FIG. 2, the rear metal plate 16 is placed on the surface opposite to the surface of the ceramic substrate 14 on which the front metal plates 15 are placed and the rear metal plate 16 is layered in the thickness direction of the ceramic substrate 14. The thickness of the rear metal plate 16 (plate thickness) is 1.1 mm. FIG. 3($a$) is a plan view illustrating the rear metal plate 16 vied from the joint surface 16$b$, where the heat sink 13 is illustrated with a two-dot chain line.

The configuration of the rear metal plate 16 in the present embodiment will be described in further detail with reference to FIG. 3. As illustrated in FIG. 3($a$), a plurality of recesses 18 (thirty-six (36) recesses in the present embodiment) are formed in the rear metal plate 16 as circular holes in a plan view. As illustrated in FIG. 3($b$), each recess 18 is a hole with a bottom and extends in a thickness direction of the rear metal plate 16. Each recess 18 is formed by carrying out an etching process on the surface of the rear metal plate 16 opposite to the joint surface 16$a$ joined to the ceramic substrate 14, i.e., on the joint surface 16$b$, which is joined to the heat sink 13. Here, a wiring pattern is formed on the front metal plates 15 through the etching process, and the recesses 18 are formed together with the wiring pattern. The circuit substrate 11 is joined to the heat sink 13 after carrying out a predetermined etching process on the front metal plates 15 and the rear metal plate 16.

Each recess 18 has a circular opening having a diameter of 2 mm in the joint surface 16$b$ of the rear metal plate 16. That is, the area of the opening in the recess 18 on the joint surface 16$b$ is $\pi \times (2 \times 0.5)^2 = 3.14$ mm$^2$ (rounded off to the hundredth). In addition, each recess 18 is formed so as to have a depth of 0.5 mm in the thickness direction of the rear metal plate 16. As a result, the thickness of the rear metal plate 16 beneath the respective recesses 18 is 0.6 mm, because the recesses 18 are formed to a depth of 0.5 mm (1.1 mm−0.5 mm). In addition, the diameter of the respective recesses 18 has a numerical value which is no greater than two times the distance between the surface of the semiconductor elements 12 from which heat is emitted (surface joined to front metal plates 15) and the recesses 18 (0.6 mm+0.635 mm+0.6 mm=1.835 mm in the present embodiment). That is, the value of the diameter of each recess 18 is set taking the state of heat conduction between the semiconductor elements 12 (heat emitting bodies) and the recess 18 into consideration.

On the joint surface 16$b$ of the rear metal plate 16 having the recesses 18, hollow portions formed by the recesses 18 (openings of the recesses 18) become a non-joint area (area where the metal plate is not joined to the heat sink 13), while the flat portion excluding the recesses 18 becomes a joint area (area where the metal plate is joined to heat sink 13). The total area of the joint surface 16$b$ is 27 mm×27 mm=729 mm$^2$ while the joint area (area through which the heat sink and the metal plate are joined) is 616.0 mm$^2$. The joint area (616.0 mm$^2$) is calculated by subtracting the total value of the area of the openings of the recesses 18 (36×3.14 (mm$^2$)=113.0 mm$^2$ (rounded off to the tenth)) from the total area of 729 mm$^2$. The ratio of the joint area to the total area of the joint surface 16$b$ (joint ratio) is 84.5% (rounded off to the tenth).

As illustrated in FIG. 3($a$), the recesses 18 are aligned along the peripheral portion of the rear metal plate 16. In addition, the recesses 18 are arranged in such a manner that when the rear metal plate 16 is divided into a plurality of equal flat regions, the joint area is the same in all the regions. FIG. 3($a$) illustrates a state where the rear metal plate 16 is divided in four with center lines connecting the centers of the opposite sides using a broken line, and symbols a, b, c and d indicate the regions. "The joint area is the same in all the regions into which the metal plate is divided" is not intended to suggest that the regions are symmetrical, but rather suggest that the calculated values are equal irrespectively of the size and arrangement of the recesses 18 in the case where the joint area is calculated in the respective regions. Here, the number of regions into which the metal plate is divided is not limited to four and may be two or three. The direction in which the metal plate is divided is not limited to the longitudinal and horizontal directions and may be along diagonal lines. In FIG. 3($a$), the joint area is the same in all of the regions a to d, and the recesses 18 are formed so as to be arranged in line symmetry with the center lines connecting the centers of the opposite sides of the rear metal plate 16 as borders.

The semiconductor module 10 formed in this manner can be applied to vehicles such as hybrid cars where an electric motor is used as a part of a driving source, and thus, the power supplied to the electric motor is controlled in accordance with the conditions for driving the vehicle. In addition, heat emitted from the semiconductor elements 12 is conveyed to the heat sink 13 via the circuit substrate 11 and dissipated into a cooling fluid which flows through the heat sink 13.

When heat emitted from the semiconductor elements 12 is conveyed to the heat sink 13, the temperature becomes high in the circuit substrate 11 and the heat sink 13, which causes thermal expansion thereof. Meanwhile, when heat emission from the semiconductor elements 12 stops, the temperature lowers to room temperature in the circuit substrate 11 and the heat sink 13, which causes thermal contraction thereof. Thus, at the time of thermal expansion and thermal contraction, thermal stress occurs due to the difference in the coefficient of linear thermal expansion of the respective elements (heat sink 13, ceramic substrate 14, front metal plates 15 and rear metal plate 16). In the semiconductor module 10 in the present embodiment, however, thermal stress in the joint area is dispersed and alleviated by the non-joint area formed by the recesses 18 in the rear metal plate 16. That is, the non-joint area formed by the recesses 18 serves as a thermal stress alleviating portion for alleviating thermal stress in the joint area. As a result, occurrence of cracking and distortion can be prevented, whereby the heat dissipating performance can be maintained over a long period of time.

FIG. 4 illustrates the relationship between the thermal resistance (degree ° C./W) and the joint ratio (%) when the recesses 18 (non-joint area) are formed in the rear metal plate 16. This relationship was found from test results.

As illustrated in FIG. 4, the thermal resistance and the joint ratio have such a relationship that, when the joint ratio decreases, the thermal resistance is increased, which makes the heat conducting properties deteriorate, while, when the joint ratio increases, the thermal resistance is decreased, which makes the heat conducting properties improve. In the semiconductor module 10, both the improvement in the heat dissipating performance and alleviation of thermal stress are necessary. In order to place priority on the heat dissipating performance, it is the best to make the joint ratio close to 100%, as illustrated in FIG. 4. However, in that case, thermal stress cannot be alleviated. In order to place priority on the alleviation of thermal stress, it is the best to lower the joint ratio (that is, increase the non-joint area). However, in that case, the value of the thermal resistance increases, which makes the heat dissipating performance deteriorate, as illustrated in FIG. 4.

Thus, the tests were performed by changing the joint ratio on the basis of the above relationship, and it was concluded that the range of the joint ratio for gaining the best results from the point of view of increase in the heat dissipating performance and alleviation of thermal stress is a range from 65% to 85%, as illustrated in FIG. 4. The lower limit value for the joint ratio is set to 65%, which is the lower end of the area in which no observable fluctuation in the value of the thermal resistance can be found. In the range less than the joint ratio of 65%, the value of the thermal resistance greatly fluctuates and may have adverse affects on the heat dissipating performance. The upper limit value for the joint ratio is set to 85%, which is the upper end of the area in which thermal stress is alleviated and occurrence of cracking and distortion caused by repeated thermal expansion and thermal contraction can be prevented. In order to adjust the joint ratio to 65%, thirty six (36) recesses 18 each having a diameter of 3 mm may be formed in the joint surface 16b of the rear metal plate 16 of 27 mm×27 mm, for example.

As described above, the best results can be obtained when the lower limit value for the range of the joint ratio is 65%. However, taking the thermal conductivity of the aluminum nitride that forms the ceramic substrate 14 (170 W/m·k) and the thermal conductivity of the pure aluminum that forms the rear metal plate 16 (220 W/m·k) into consideration, a range from 75% to 85% is more preferable for the joint ratio, because the effects of thermal resistance is further reduced. In specifically, heat emitted from the semiconductor elements 12 is conveyed to the ceramic substrate 14 via the front metal plates 15 but it is difficult for heat to be conveyed from the ceramic substrate 14 to the rear metal plate 16 since the thermal conductivity of aluminum nitride is low in comparison with that of pure aluminum. In addition, formation of the recesses 18 (non-joint area) in the rear metal plate 16 makes the conduction of heat difficult. Therefore, in the case when the thermal conductivity is approximately the same in the rear metal plate 16 and the ceramic substrate 14, the heat conduction from the rear metal plate 16 to the heat sink 13 are not reduced any more. In order to make thermal conductivity approximately the same, it is more preferred for the lower limit value of the joint ratio between the heat sink 13 and the rear metal plate 16 to be set to 75%.

FIGS. 5(a) to 5(c) illustrate the recesses 18 in the rear metal plate 16 according to another embodiment. That is, the size (area of openings) and arrangement of the recesses 18 may be changed, as long as the joint ratio between the heat sink 13 and the rear metal plate 16 is in the range from 65% to 85% (preferably the range from 75% to 85%). FIGS. 5(a) to 5(c) illustrate examples where the arrangement of the recesses 18 is changed while the size and number of the recesses 18 are the same as in the embodiment in FIG. 3.

FIG. 5(a) illustrates an example where thirty-six (36) recesses 18 are arranged in a matrix of 6 rows×6 columns in the joint surface 16b of the rear metal plate 16. In this case, the recesses 18 are arranged throughout the entirety of the joint surface 16b. FIG. 5(b) illustrates an example where thirty-six (36) recesses 18 are arranged in concentric circles wherein the center of the rear metal plate 16 is a center of the concentric circles in the joint surface 16b of the rear metal plate 16. FIG. 5(c) illustrates an example where thirty-six (36) recesses 18 are arranged alternately or zigzag in the joint surface 16b of the rear metal plate 16. These recesses 18 are arranged in such a manner that, when the rear metal plate 16 is divided into a plurality of equal flat regions, the joint area is the same in all of the regions, as with the recesses 18 in the embodiment in FIG. 3.

Accordingly, the present embodiment has the following effects.

A non-joint area formed by the recesses 18 is provided in the rear metal plate 16. Therefore, even in the case where thermal stress is generated due to the difference in the coefficient of linear thermal expansion among the ceramic substrate 14, the rear metal plate 16 and the heat sink 13, thermal stress may be alleviated by such a non-joint area, whereby thermal stress is reduced. Therefore, occurrence of cracking and distortion can be prevented, and the heat dissipating properties can be maintained.

The recesses 18 are provided directly in the rear metal plate 16 and it is not necessary to intervene an additional metal plate or an additional buffer material including the recesses 18 between the ceramic substrate 14 and the heat sink 13, separately from the rear metal plate 16 which serves as a joining layer. Thus, increase in the number of parts of the semiconductor module 10 can be prevented. Accordingly, increase in the costs for manufacturing the semiconductor module 10 can be prevented.

The recesses 18 are formed in the rear metal plate 16 in such a manner that the joint area of the rear metal plate 16 is in a range from 65% to 85% of the total area of the joint surface 16b. Therefore, alleviation of thermal stress and heat dissipating performance can be well balanced, so that thermal stress is appropriately alleviated and excellent heat dissipating performance can be achieved.

Furthermore, the recesses 18 are formed in such a manner that the joint area of the rear metal plate 16 is in a range from 75% to 85% of the total area of the joint surface 16b (84.5% in the above embodiment). That is, the range of the joint area is set taking the thermal conductivity of aluminum nitride, which is the material of the ceramic substrate 14, and pure aluminum, which is the material of the rear metal plate 16, into consideration. Accordingly, the thermal resistance can further be reduced, and the heat dissipating performance can be improved.

The diameter of each recess 18 is set to no greater than two times the distance between the semiconductor elements 12 and the recesses 18. That is, the diameter of each recess 18 is set taking the conditions for conduction of heat emitted from the semiconductor elements 12 into consideration. Accordingly, the heat dissipating performance can be improved.

The recesses 18 are circular holes. Therefore, it is easy to design an etching pattern in the case where the recesses 18 are formed in the rear metal plate 16 through an etching process, increase in the costs for manufacturing the semiconductor module 10 can be prevented.

The recesses 18 are provided in such a manner that in the case where the rear metal plate 16 is divided into equal flat regions, the joint area is the same in all of the regions. Therefore, the recesses 18 can be formed throughout the entirety of the rear metal plate 16, so that thermal stress is appropriately alleviated. In addition, in the embodiment in FIG. 3, the recesses 18 are arranged so as to concentrate in the peripheral portion of the rear metal plate 16, and thus, thermal stress can be appropriately alleviated.

The above embodiment may be modified as follows.

As illustrated in FIGS. 6(*a*) and 6(*b*), the non-joint area may be formed of a trench portion 19 which includes a plurality of trenches. The trench portion 19 in FIG. 6(*a*) includes trenches (having bottoms) in grid form which linearly extend longitudinally and laterally in the rear metal plate 16. The trench portion 19 in FIG. 6(*b*) includes trenches in grid form which linearly extend diagonally in the rear metal plate 16. It is preferred for the width of the trench portion 19 to be no greater than two times the distance between the surface of the semiconductor elements 12 from which heat is emitted and the trench portion 19, as in the embodiments in FIGS. 3 and 5. The trench portion 19 is formed through an etching process. The trench portion 19 is formed in such a manner that, when the rear metal plate 16 is divided into a plurality of flat regions, the joint area is the same in all of the regions, as in the embodiments in FIGS. 3 and 5.

As illustrated in FIGS. 7(*a*) and 7(*b*), the non-joint area may be formed of a trench portion 20 which includes a plurality of trenches. The trench portion 20 in FIG. 7(*a*) includes trenches (having bottoms) which extend laterally in wave form in the rear metal plate 16. The trench portion 20 in FIG. 7(*b*) includes trenches which extend longitudinally in wave form in the rear metal plate 16. It is preferred for the width of the respective trenches that form the trench portion 20 to be no greater than two times the distance between the surface of the semiconductor elements 12 from which heat is emitted and the trench portion 20, as in the embodiments in FIGS. 3 and 5. The trench portion 20 is formed through an etching process. The trench portion 20 is formed in such a manner that, when the rear metal plate 16 is divided into a plurality of flat regions, the joint area is the same in all of the regions, as in the embodiments in FIGS. 3 and 5.

As illustrated in FIG. 8, the non-joint area may be formed of a trench portion 21 that includes a plurality of trenches. The trench portion 21 in FIG. 8 includes two circular trenches (each having a bottom) in concentric circles. It is preferred for the width of the respective trenches that form the trench portion 21 to be no greater than two times the distance between the surface of the semiconductor elements 12 from which heat is emitted and the trench portion 21, as in the embodiments in FIGS. 3 and 5. The trench portion 21 is formed through an etching process. In addition, the trench portion 21 is formed in such a manner that, when the rear metal plate 16 is divided into a plurality of flat regions, the joint area is the same in all of the regions, as in the embodiments in FIGS. 3 and 5.

In FIGS. 3 and 5 to 8, the size (diameter or width) of the recesses 18 and the trench portions 19 to 21 may be changed. In addition, the number of recesses 18 and the trench portions 19 to 21 may be changed. At the time of modification, the joint ratio of the rear metal plate 16 should be in a range from 65% to 85% (preferably 75% to 85%).

Figure 9A:
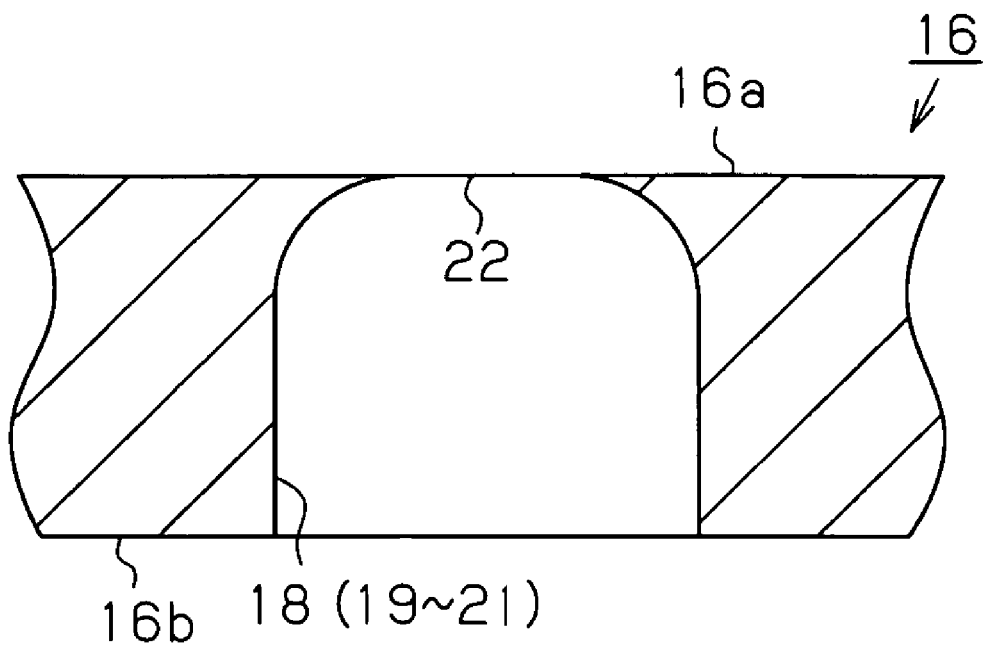
FIGS. 9(a) and 9(b) are cross sectional views illustrating a recess and a trench where the deepest portion is in fillet form.
Figure 9B:
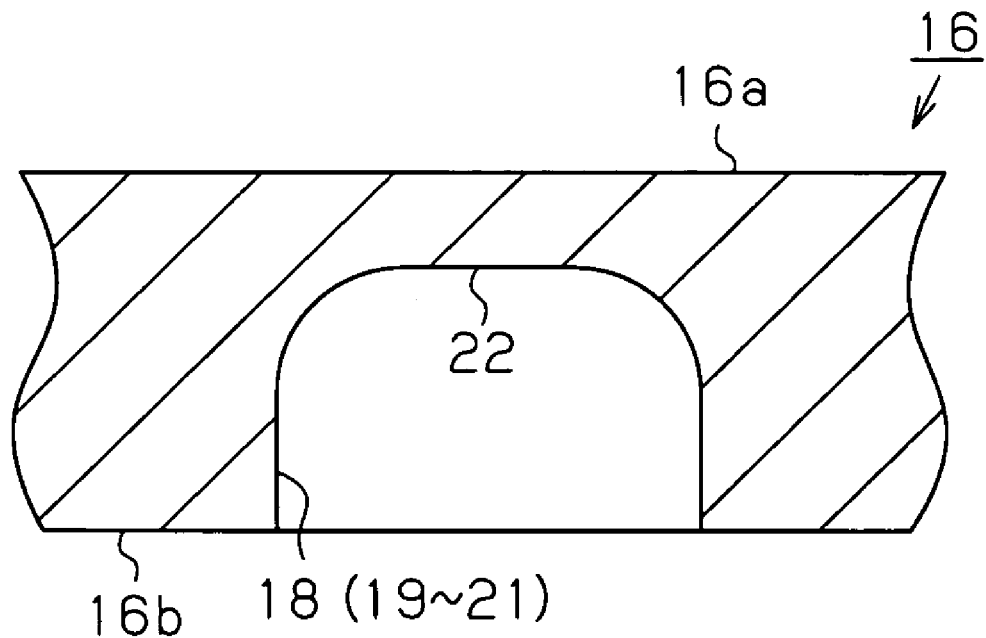

The recesses 18 illustrated in FIGS. 3 and 5 may be through-holes that penetrate through the rear metal plate 16. In addition, the trench portions 19 to 21 illustrated in FIGS. 6 to 8 may be trenches without bottoms that penetrate through the rear metal plate 16. It should be understood that, in the case where the trench portions 19 to 21 are trenches without bottoms, a connection portion is formed in the periphery of the rear metal plate 16 to avoid separation of the rear metal plate 16. In addition, in the case where the recesses 18 are through-holes or the trench portions 19 to 21 are trenches without bottoms, as illustrated in FIG. 9(*a*), the deepest portion 22 on the joint surface 16*a* side may be in fillet form with the opening on the joint surface 16*b* of the rear metal plate 16. This portion becomes an opening on the side of the joint surface 16*a* of the rear metal plate 16. This configuration makes it difficult for the rear metal plate 16 to separate from the joint between the ceramic substrate 14 and the rear metal plate 16 compared with the case where the edge of the opening of the hole or trench is angular. Accordingly, the heat dissipating performance can be improved.

In the case where the recesses 18 and the trench portions 19 to 21 do not penetrate through the metal plate, as illustrated in FIG. 9(*b*), the deepest portion 22 of the recesses 18 and the trench portions 19 to 21 may be in fillet form. In this case, occurrence of cracking can be prevented, as compared to the case where the edge in the deepest portion 22 of the recesses 18 and the trench portions 19 to 21 is angular.

The recesses 18 illustrated in FIGS. 3 and 5 may be changed in any form, including triangular, hexagonal, diamond or star, instead of circular.

The diameter and the width of the recesses 18 and the trench portions 19 to 21 may be uneven. In FIG. 3, for example, recesses 18 having a diameter of 2 mm and recesses 18 having a diameter of 3 mm may be mixed.

The arrangement of the recesses 18 and the trench portions 19 to 21 illustrated in FIGS. 3 and 6 to 8 may be changed. In FIG. 3, for example, the recesses 18 may be positioned around the semiconductor elements 12 and not directly beneath the semiconductor elements 12. In this case, portions of the rear metal plate 16 directly beneath the semiconductor elements 12 become the joint surface for the heat sink 13, and therefore, heat from the semiconductor elements 12 can be efficiently dissipated.

The thickness of the ceramic substrate 14, the surface metal plate 15 and the rear metal plate 16 that form the circuit substrate 11 may be changed. The thickness of the ceramic substrate 14 may be changed in a range from 0.1 mm to 1.1 mm, for example. In the case where the thickness of the ceramic substrate 14 is set so as to be the same or greater than the thickness of the front metal plates 15 or the rear metal plate 16, it becomes difficult for the metal plates to separate due to the heat cycle. In the above embodiments, the rear metal plate 16 having a thickness of 1.1 mm is used for the ceramic substrate 14 having a thickness of 0.635 mm. By forming the recesses 18 having a depth of 0.5 mm in the rear metal plate 16, the thickness beneath the recesses 18 becomes 0.6 mm (1.1 mm−0.5 mm), which is smaller than the thickness of the ceramic substrate 14. In addition, the thickness of the front metal plates 15 and the rear metal plate 16 may be changed within a range of 0.1 mm to 1.1 mm. It is preferred for the thickness of the front metal plates 15 to be great because the current passing therethrough can be increased. Particularly, it is preferred for thickness of the plate 15 to be set to 0.6 mm to 1.1 mm. In addition, it is preferred for the front metal plates 15 and the rear metal plate 16, which are placed so as to sandwich the ceramic substrate 14, to have the same thickness, taking the effects such as warping due to heat into consideration. Accordingly, in the case where the thickness of the front metal plates 15 is set to 0.6 mm to 1.1 mm, it is preferred for the rear metal plate 16 to be in the same thickness range: 0.6 mm to 1.1 mm. Although the thickness of the front metal plates 15 and the thickness of the rear metal plate 16 are different in the above embodiments, the thickness of the front metal plates 15 and that of the rear metal plate 16 may be the same.

The rear metal plate 16 may have a double-layer structure. In specifically, the rear metal plate 16 may be formed of a metal plate which is joined to the ceramic substrate 14 and a metal plate having recesses 18 (for example, punched metal) which is inserted between the metal plate and the heat sink 13.

The front metal plates 15 and the rear metal plate 16 may be made of aluminum alloy instead of pure aluminum. For example, Al—Mg—Si based alloy containing 0.2 mass % to 0.8 mass % of Si, 0.3 mass % to 1 mass % of Mg, 0.5 mass % or less of Fe and 0.5 mass % or less of Cu, at least one of 0.1 mass % or less of Ti and 0.1 mass % or less of B, the rest of mass % made of Al and unavoidable impurities, may be used. As long as the necessary heat conveying properties can be secured, 3000 series aluminum alloy or the like may be used.

It is not necessary for the front metal plates and the rear metal plate to be joined directly to the ceramic substrate.

The invention claimed is:

1. A semiconductor module comprising:
   a ceramic substrate having a front surface on which a semiconductor element is mounted and a rear surface on the opposite side of the front surface;
   a front metal plate joined to the front surface;
   a rear metal plate joined to the rear surface; and
   a heat dissipating apparatus joined to the rear metal plate, wherein
   the ceramic substrate includes aluminum nitride while the front metal plate and the rear metal plate include aluminum, and
   the rear metal plate has a joint surface that faces the heat dissipating apparatus, wherein the joint surface includes a joint area and a non joint area, wherein the joint area is in a range from 65% to 85% of the total area of the joint surface, wherein the non joint area includes a hole or a trench formed in the joint surface and
   the deepest portion of the hole or the trench in the joint surface is in fillet form.

2. The semiconductor module according to claim 1, wherein the non-joint area is formed by carrying out an etching process on the rear metal plate.

3. The semiconductor module according to claim 1, wherein the non-joint area is formed in such a manner that, in the case where the rear metal plate is divided into equal flat regions, the joint area is the same in all of the regions.

4. The semiconductor module according to claim 1, wherein the front metal plate and the rear metal plate are made of pure aluminum.

5. The semiconductor module according to claim 1 wherein the ceramic substrate has a thickness of 0.1 mm to 1.1 mm, the front metal plate has a thickness of 0.1 mm to 1.1 mm, and the rear metal plate has a thickness of 0.1 mm to 1.1 mm.

* * * * *